United States Patent [19]

Motoyama

[11] 4,417,776

[45] Nov. 29, 1983

[54] CONNECTION TERMINAL DEVICE FOR ELECTRICAL IMPLEMENTS

[75] Inventor: Kazuyasu Motoyama, Hachioji, Japan

[73] Assignee: Olympus Optical Co., Ltd., Tokyo, Japan

[21] Appl. No.: 288,494

[22] Filed: Jul. 30, 1981

[30] Foreign Application Priority Data

Aug. 12, 1980 [JP] Japan .......................... 55-114157[U]
Aug. 12, 1980 [JP] Japan .......................... 55-114158[U]

[51] Int. Cl.³ ............................................. H01R 9/07
[52] U.S. Cl. ........................ 339/17 F; 339/176 MF; 339/255 R
[58] Field of Search ............... 339/17 F, 176 MF, 28, 339/29 R, 4, 193 P, 255 R

[56] References Cited

U.S. PATENT DOCUMENTS

| | | | |
|---|---|---|---|
| 2,706,803 | 4/1955 | Templeton | 339/255 R |
| 3,065,446 | 11/1962 | Robb et al. | 339/17 F |
| 3,634,806 | 1/1972 | Fergusson | 339/17 F |
| 3,727,168 | 4/1973 | Henschen et al. | 339/17 F |
| 3,727,170 | 4/1973 | Mosier et al. | 339/176 MF |
| 3,729,603 | 4/1973 | Foltz | 339/4 |
| 3,806,767 | 4/1974 | Lehrfeld | 339/176 MF |
| 3,941,448 | 3/1976 | Evans | 339/176 MF |
| 4,060,295 | 11/1977 | Tomkiewcz | 339/17 F |
| 4,105,278 | 8/1978 | Braund et al. | 339/176 MF |
| 4,119,813 | 10/1978 | Sato | 179/100.11 |

Primary Examiner—John McQuade
Assistant Examiner—Gary F. Paumen
Attorney, Agent, or Firm—Frishauf, Holtz, Goodman & Woodward

[57] ABSTRACT

A connection terminal device for an electrical implement having a circuit substrate provided in a housing comprises a flexible substrate which is set in the housing and one end of which contacts the circuit substrate, and a plurality of printed lines which are mounted on the surface of the flexible substrate, and each of which is provided with a first terminal exposed to the open air and a second terminal electrically connected to the terminal of the circuit substrate.

18 Claims, 8 Drawing Figures

CONNECTION TERMINAL DEVICE FOR ELECTRICAL IMPLEMENTS

BACKGROUND OF THE INVENTION

This invention relates to a connection terminal device which is mounted on an electrical implement having a circuit substrate held in a housing to detachably couple the terminal of said circuit substrate for electrical connection to that of another electrical implement.

The conventional connection terminal device for an electric implement is represented by a plug and socket metal part. A lead is electrically connected at one end by soldering to the plug or socket metal part.

With such a conventional connection terminal device, it is necessary to carry out soldering at two spots at least in order to electrically connect the plug or socket metal part of a connection terminal device to one terminal of a circuit substrate of an electrical implement. The larger the number of soldering spots, the more complicated the electrical connection work. Consequently, increase arises in the work steps and hours, eventually elevating the manufacturing cost. Where an electrical implement is practically applied, an increase in the number of soldering spots unavoidably causes electrical connection to be cut off more often than otherwise. The smaller the size of an electrical implement, the more complicated the work of electrical connection.

SUMMARY OF THE INVENTION

It is accordingly the object of this invention to provide such a connection terminal device for an electrical implement as allows for a decrease in the number of work steps and hours and material cost and the manufacturing cost, and reduces the possibility of electrical connection being cut off during the application of an electrical implement.

DETAILED DESCRIPTION OF THE PREFERRED EMBODIMENTS

Figure 1:
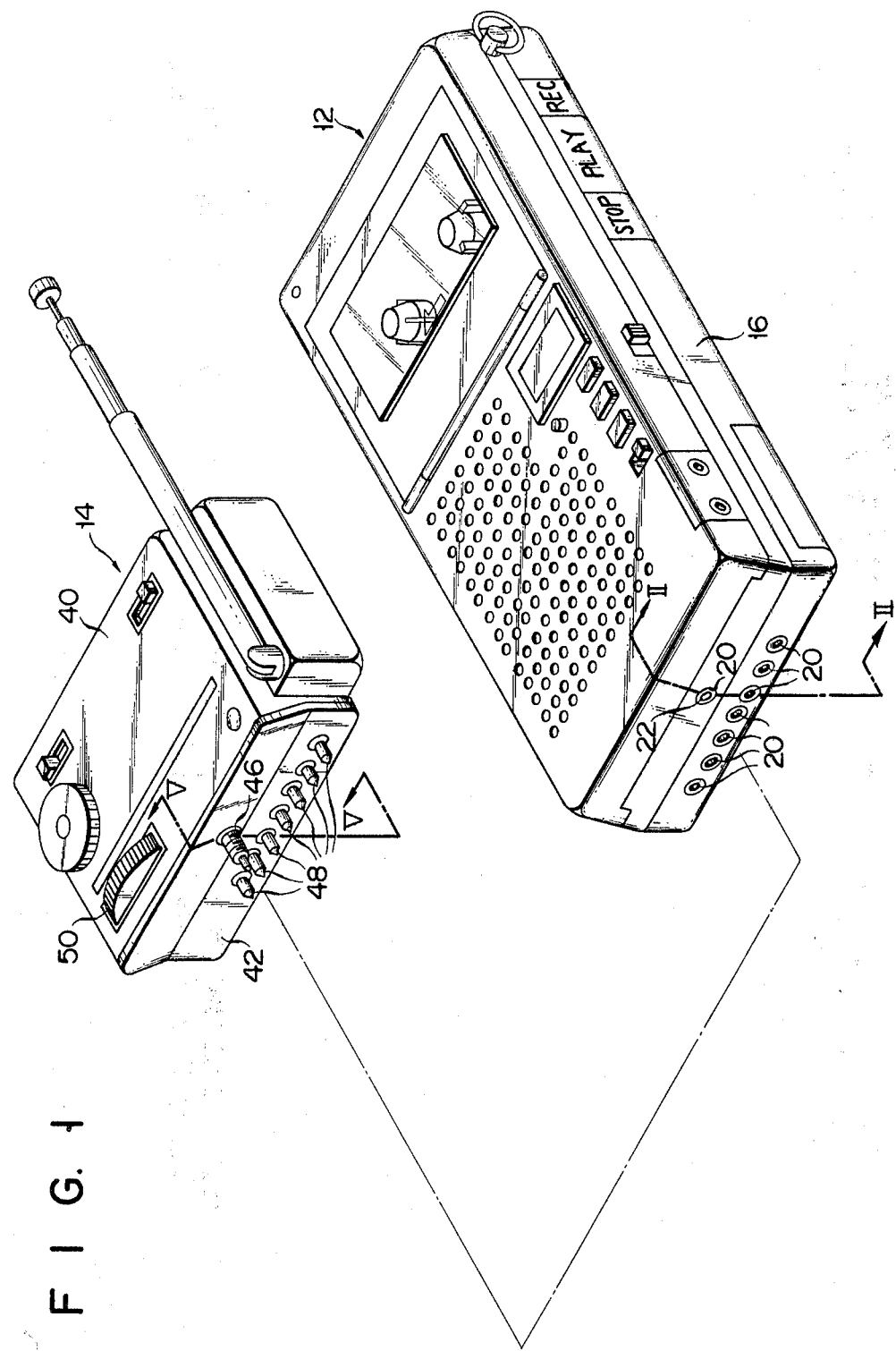
FIG. 1 gives a perspective view of a first electric implement provided with a connection terminal device according to a first embodiment of this invention and a perspective view of a second electrical implement provided with a connection terminal device according to a second embodiment of the invention.

FIG. 1 indicates electrical implements 12, 14 provided with connection terminal devices according to different embodiments of this invention. The electrical implement 12 is a tape recorder using a tape cassette referred to as "a microcassette". The other electrical implement 14 is a unit detachably fitted to said tape recorder 12. A known attachment to this tape recorder 12 includes, for example, an FM/AM tuner, FM tuner, AM tuner, voice actuator and directional microphone. The electrical implement 14 is an FM/AM tuner.

Figure 2:
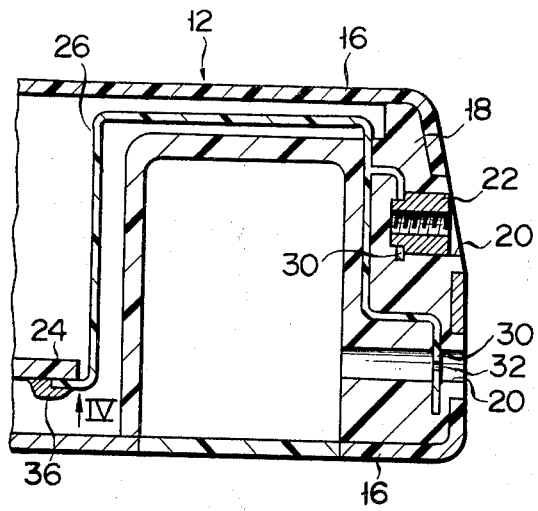
FIG. 2 is a schematic sectional view taken along line II—II of FIG. 1.

The electrical implement 12 comprises, as shown in FIG. 2, a block 18 of nonconducting synthetic resin provided on the rear side of the housing 16 and exposed to the open air.

Figure 3:
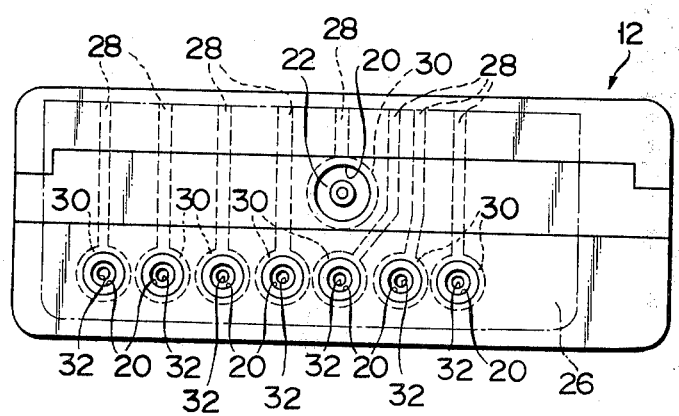
FIG. 3 is an elevation of the rear side of the first electrical implement of FIG. 1.

The block 18 is provided with a plurality of guide holes 20 communicating with the open air. One of the guide holes 20 is fitted, as shown in FIGS. 1 to 3, with a conducting member 22 in which internal or female threads are formed.

As shown in FIG. 2, a circuit substrate 24 is provided in the housing 16. Further, part of a flexible substrate 26 is embedded in the block 18 as an integral part. With the foregoing embodiment, the flexible substrate 26 is partly embedded in the block 18 when said block 18 is injection molded. As indicated in FIG. 3, a plurality of printed lines 28 corresponding to the plural guide holes 20 are mounted on the surface of the flexible substrate 26. Each of the plural printed lines 28 has a first terminal 30 provided in each of the plural guide holes 20. As shown in FIGS. 2 and 3, one of the first terminals 30 is electrically connected to the conducting member 22. The remaining first terminals 30 communicate with the open air through the plural guide holes 20 which do not contain the conducting member 22. As seen from FIGS. 2 and 3, those of the first terminals 30 which communicate with the open air are each penetrated by a through hole 32.

Figure 4:
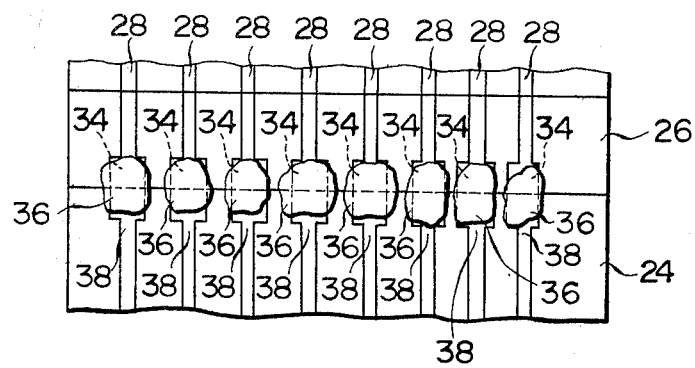
FIG. 4 is a bottom view of a circuit substrate and flexible substrate as taken in the direction of an arrow IV given in FIG. 2.

As seen from FIG. 2, the other end of the flexible substrate 26 is set adjacent to one side of the circuit substrate 24. As indicated in FIG. 4, the second terminal 34 of each of the printed lines 28 is set on the other side of the flexible substrate 26. As shown in FIGS. 2 and 4, the plural second terminals 34 of the printed lines 28 are respectively electrically connected to the plural terminals 38 of the circuit substrate 24 by means of solder 36.

Figure 5:
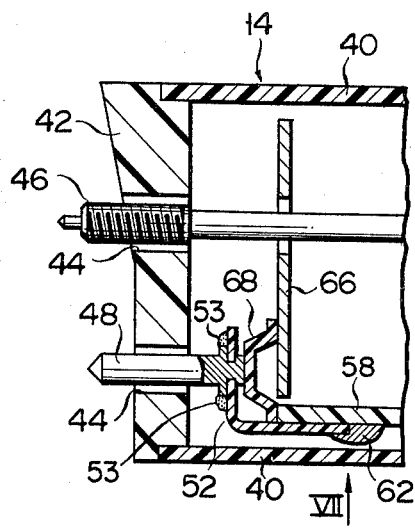
FIG. 5 is a fractional sectional view on line V—V of FIG. 1.

As shown in FIG. 5, the other electrical implement 14 of FIG. 1 has a nonconducting synthetic resin block 42 formed on the front side of the housing 40 in a state exposed to the open air. The synthetic resin block 42 is penetrated by a plurality of penetrating holes 44 communicating with the open air.

An externally threaded member 46 is mounted in the one of the plural penetrating holes 44. The remaining penetrating holes 44 are each fitted with a conducting plug 48.

As seen from FIGS. 1 and 5, one end of the externally threaded member 46 projects into the open air. The other end of said externally threaded member 46 is positioned inside of the housing 40 (FIG. 5) in connection to a rotatable knob 50 (FIG. 1). Where the knob 50 is turned in either direction, then the externally threaded member 46 is rotated in the same direction.

As indicated in FIGS. 1 and 5, one end portion of each of the plural plugs 48 projects into the open air, and the other end is positioned inside of the housing 40. Said other end is securely caulked by caulk 53 into the flexible substrate 52 as shown in FIG. 5.

Figure 6:
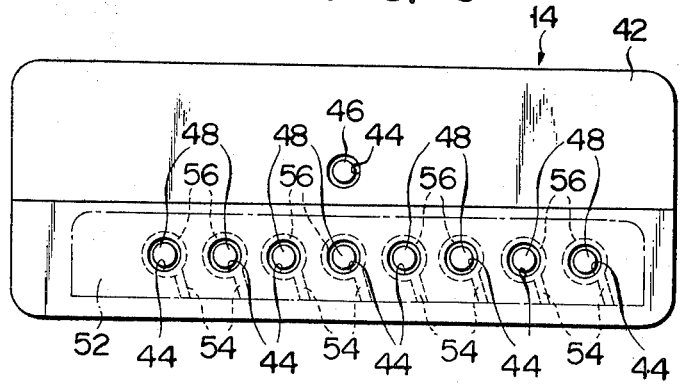
FIG. 6 is an elevation of the rear side of the second electrical implement of FIG. 1.

As shown in FIG. 6, plural printed lines 54 corresponding to the plural plugs 48 are mounted on the surface of the flexible substrate 52. These printed lines 54 are each provided with a first terminal 56 electrically connected to the other end of the corresponding plug 48.

Figure 7:
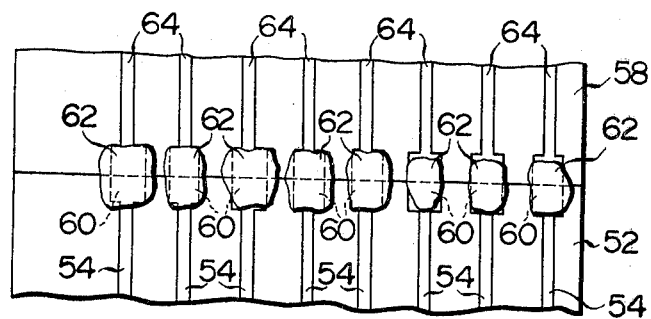
FIG. 7 is a bottom view of the circuit substrate and flexible substrate as taken in the direction of an arrow VII given in FIG. 5.

As seen from FIG. 7, one side of the flexible substrate 52 is set adjacent to the circuit substrate 58 held in the housing 40. Said one side of the flexible substrate 52 is provided with the second terminals 60 of the respective printed lines 54. Each second terminal 60 is respectively electrically connected to each of the plural terminals 64 of the circuit substrate 58 by means of solder 62.

As indicated in FIG. 5, a chassis 66 is provided in the housing 40 behind the other end of the plug 48. Elastic urging means 68 is positioned between the chassis 66 and the other end of the plug 48. Said urging means 68 is prepared from synthetic rubber with a hollow trapezoidal sectional form. As seen from FIG. 5, the top side of said trapezoidal urging means 68 contacts the other end of the plug 48, and the bottom side of said trapezoidal urging means 68 is fixed to the surface of the chassis 66, for example, by means of adhesive.

Figure 8:
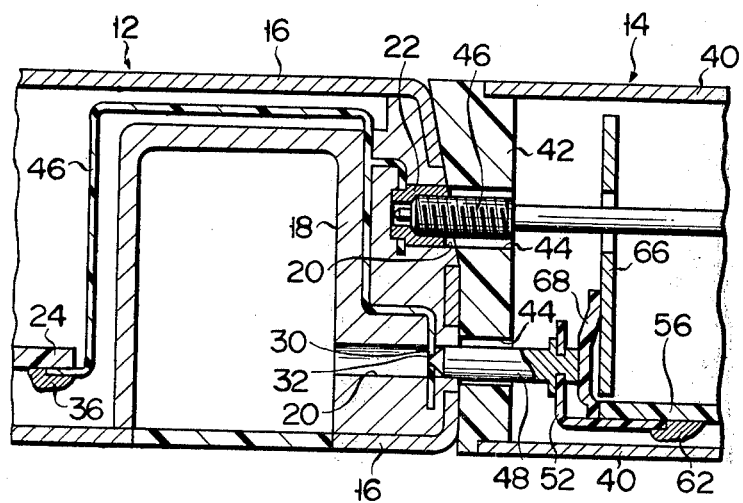
FIG. 8 is a sectional view of the connected first and second electrical implements as taken in the same direction as in FIGS. 2 and 3.

Where, as illustrated in FIG. 8, the plural plugs 48 and externally threaded male member 46 of the electrical implement 14 of FIG. 1 are inserted into the plural guide holes 20 of the other electrical implement 12 of FIG. 1, and the knob 50 is rotated in a prescribed direction, then the threaded member 46 is threaded into the female threads, thereby causing the electrical implement 14 to be detachably connected to the electrical implement 12. In this case, the end of each of the plural plugs 48 is pressed, as shown in FIG. 8, against each of the plural first terminals 30 of the flexible substrate 26 of the electrical implement 12. As a result, the plug 48 pressed against said first terminal 30 is moved by the contact pressure against the force of the urging means 68 in the rearward direction, thereby causing the projecting end of said plug 48 to be drawn near the housing 40. Since one end of the plug is always pressed against the first terminal 30 of the electrical equipment 12 by the force of the urging means 68, electrical contact betwwen said first terminal and the plug 48 of the second electrical implement 14 is not cut off, even when some shocks are applied to either or both of said electrical implements. Further where the projecting end of the plug 48 is pointed, as illustrated in FIG. 5, said pointed end of the plug 48 is easily inserted, as shown in FIG. 8, into the hole 32 of the first terminal 30 of the electrical implement 12, when both electrical implements 12, 14 are connected together. The above arrangement elevates the earthquake-proof property of the electrically connected portions of the plug 48 and the first terminal of the plug 48 and the first terminal of the electrical implement 12.

Where the knob 50 of the electrical implement 14 is rotated in a direction opposite to the previously mentioned prescribed direction, then the male threads of member 46 of the electrical implement 14 and the female threads of the conductive member 22 of the electrical implement 12 are disengaged from each other as shown in FIG. 1.

A connection terminal device embodying this invention for an electrical implement having a circuit substrate provided in a housing comprises:

a flexible substrate which is set in the housing and one end of which contacts the circuit substrate; and a plurality of printed lines which are mounted on the surface of the flexible substrate, and each of which is provided with a first terminal exposed to the open air and a second terminal electrically connected to the terminal of the circuit substrate.

The connection terminal device of this invention for an electrical implement has the advantages over the conventional type that not only a reduction is assured in the number of work steps and hours and material cost and manufacturing cost, but also when put to practical application, an electrical implement is less likely to have its electrical connection shut off.

With the connection terminal device of the invention, it is possible to fix the flexible substrate in the housing, provide a plurality of guide holes communicating with the open air in the housing, and set the first terminals of the respective printed lines in the guide holes.

It is preferred for the connection terminal device of the invention that the housing be prepared from nonconductive synthetic resin, and the flexible substrate be integrally embedded in the housing when said housing is molded. This arrangement simplifies the manufacture of the housing and the assembly of said housing and flexible substrate.

With such construction, the manufacturing of the housing and the assembly between the housing and the flexible substrate becomes easier.

With the connection terminal device of the invention, the first terminal of each of the printed lines can be provided with a plug where the other end projects into the open air. It is preferred for the connection terminal device of the invention that the plug be made axially movable through the housing; and the flexible substrate be provided with urging means for urging the plug in a direction in which the projecting end of said plug is moved away from the housing. This arrangement assures electrical connection between the plug and the socket into which the plug is inserted.

It is preferred for the connection terminal device of the invention that the urging means be prepared from elastic synthetic resin. This arrangement enables the urging means to be produced easily and at low cost.

It is preferred for the connection terminal device of the invention that after penetrating the flexible substrate, the base end of the plug be caulked to let the plug be securely fixed to the flexible substrate. This arrangement allows for the easy and reliable fixing of the plug to the flexible substrate.

It will be noted that the foregoing embodiment is given simply to describe this invention and does not limit the invention in any way. Obviously, the invention can be applied with various changes and modifications within the technical scope of the invention. All these changes and modifications should be considered to be included in the invention.

What is claimed is:

1. In an electrical implement comprising a housing; a circuit substrate provided in said housing and having a plurality of terminals; and a connection terminal device, the improvement wherein said connection terminal device comprises:

a flexible substrate mounted in said housing, said flexible substrate having two ends, one end thereof contacting said circuit substrate; and a plurality of printed conductive lines mounted on the surface of said flexible substrate, each of said printed conductive lines being provided with a first terminal exposed to the open air and a second terminal electrically connected to a terminal of said circuit substrate;

a plug coupled to said first terminal of each of said printed conductive lines, said plugs having inner ends and outer ends projecting into the open air and said plugs being axially movable through said housing; and urging means coupled to said plugs for urging said plugs in a direction in which said projecting outer end of the plug is moved away from the housing.

2. Apparatus according to claim 1, wherein said flexible substrate is fixed in said housing; said housing is provided with a plurality of guide holes communicating with the open air; and said first terminal of each of said printed conductive lines is set in each of the guide holes.

3. Apparatus according to claim 2, wherein said housing is made of nonconducting synthetic resin; and said flexible substrate is molded into the housing.

4. Apparatus according to claim 1, wherein said urging means is formed of elastic synthetic resin.

5. Apparatus according to claim 3 or 4, wherein said housing comprises a fixed member, and wherein said urging means is coupled between said fixed member and said inner ends of said plugs.

6. Apparatus according to claim 5, wherein said urging means comprise hollow elastic members of open generally trapezoidal form.

7. Apparatus according to any one of claims 1, 2, 3 or 4, comprising caulk applied between a base end of said plugs and said flexible substrate to fixedly secure said plugs to said flexible substrate.

8. Apparatus according to claim 5, comprising caulk applied between a base end of said plugs and said flexible substrate to fixedly secure said plugs to said flexible substrate.

9. Apparatus according to claim 6, comprising caulk applied between a base end of said plugs and said flexible substrate to fixedly secure said plugs to said flexible substrate.

10. In an electrical implement comprising a housing; a circuit substrate provided in said housing and having at least one terminal and a connection terminal device, the improvement wherein said connection terminal device comprises:

a flexible substrate mounted in said housing, said flexible substrate having two ends, one end thereof contacting said circuit substrate; and at least one printed conductive line mounted on the surface of said flexible substrate, said at least one printed conductive line being provided with a first terminal exposed to the open air and a second terminal electrically connected to a terminal of said circuit substrate;

at least one plug coupled to said first terminal of said at least one printed conductive line, said at least one plug having an inner end and an outer end projecting into the open air and said at least one plug being axially movable through said housing; and urging means coupled to said at least one plug for urging said at least one plug in a direction in which said projecting outer end of said at least one plug is moved away from the housing.

11. Apparatus according to claim 10, wherein said flexible substrate is fixed in said housing; said housing is provided with at least one guide hole communicating with the open air; and said first terminal of said at least one printed conductive line is set in a respective guide hole.

12. Apparatus according to claim 11, wherein said housing is made of nonconducting synthetic resin; and said flexible substrate is molded into the housing.

13. Apparatus according to claim 10, wherein said urging means is formed of elastic synthetic resin.

14. Apparatus according to claim 12 or 13, wherein said housing comprises a fixed member, and wherein said urging means is coupled between said fixed member and said inner end of said at least one plug.

15. Apparatus according to claim 14, wherein said urging means comprises at least one hollow elastic member of open generally trapezoidal form.

16. Apparatus according to any one of claims 10, 11, 12 or 13, comprising caulk applied between a base end of said at least one plug and said flexible substrate to fixedly secure said at least one plug to said flexible substrate.

17. Apparatus according to claim 14, comprising caulk applied between a base end of said at least one plug and said flexible substrate to fixedly secure said at least one plug to said flexible substrate.

18. Apparatus according to claim 15, comprising caulk applied between a base end of said at least one plug and said flexible substrate to fixedly secure said at least one plug to said flexible substrate.

* * * * *